(12) United States Patent
Kahan

(10) Patent No.: US 7,764,629 B2
(45) Date of Patent: Jul. 27, 2010

(54) IDENTIFYING CONNECTED COMPONENTS OF A GRAPH IN PARALLEL

(75) Inventor: Simon H. Kahan, Seattle, WA (US)

(73) Assignee: Cray Inc., Seattle, WA (US)

( * ) Notice: Subject to any disclaimer, the term of this patent is extended or adjusted under 35 U.S.C. 154(b) by 951 days.

(21) Appl. No.: 11/201,765

(22) Filed: Aug. 11, 2005

(65) Prior Publication Data
US 2006/0034194 A1 Feb. 16, 2006

Related U.S. Application Data

(60) Provisional application No. 60/600,448, filed on Aug. 11, 2004.

(51) Int. Cl.
*G06N 99/00* (2010.01)
(52) U.S. Cl. .................... 370/255; 716/1; 716/4; 707/E17.11
(58) Field of Classification Search .................. 370/255; 706/12; 709/220; 717/151; 703/16; 711/202; 716/7; 702/19
See application file for complete search history.

(56) References Cited

U.S. PATENT DOCUMENTS

| | | | | |
|---|---|---|---|---|
| 5,170,393 A | * | 12/1992 | Peterson et al. | 370/255 |
| 5,347,654 A | * | 9/1994 | Sabot et al. | 717/151 |
| 5,732,072 A | * | 3/1998 | Thanner et al. | 370/255 |
| 5,784,557 A | * | 7/1998 | Oprescu | 709/220 |
| 6,230,151 B1 | * | 5/2001 | Agrawal et al. | 706/12 |
| 6,438,734 B1 | * | 8/2002 | Lu | 716/7 |
| 6,442,663 B1 | * | 8/2002 | Sun et al. | 711/202 |
| 2002/0087275 A1 | * | 7/2002 | Kim et al. | 702/19 |
| 2005/0091025 A1 | * | 4/2005 | Wilson et al. | 703/16 |
| 2006/0034194 A1 | * | 2/2006 | Kahan | 370/255 |

OTHER PUBLICATIONS

Reif, John H., "Depth-First Search is Inherently Sequential," Center for Research in Computing Technology, Aiken Computation Laboratory, Division of Applied Science, Harvard University, Cambridge, MA, Preprint of paper appearing in "Information Processing Letters," vol. 20, Issue 5, Jun. 12, 1985 (6 pgs.).

* cited by examiner

*Primary Examiner*—Dang T Ton
*Assistant Examiner*—Lionel Preval
(74) *Attorney, Agent, or Firm*—Perkins Coie LLP

(57) ABSTRACT

A method and system for finding connected components of a graph using a parallel algorithm is provided. The connected nodes system performs a search algorithm in parallel to identify subgraphs of the graph in which the nodes of the subgraph are connected. The connected nodes system also identifies which subgraphs have at least one edge between their nodes. Thus, the connected nodes system effectively generates a hyper-graph with the subgraphs as hyper-nodes that are connected when subgraphs have at least one edge between their nodes. The connected nodes system may then perform a conventional connected component algorithm on the hyper-graph to identify the connected hyper-nodes, which effectively identifies the connected nodes of the underlying graphs.

17 Claims, 9 Drawing Sheets

IDENTIFYING CONNECTED COMPONENTS OF A GRAPH IN PARALLEL

CROSS-REFERENCE TO RELATED APPLICATION

This application claims the benefit of U.S. Provisional Application No. 60/600,448, filed Aug. 11, 2004, and incorporated herein by reference.

BACKGROUND

In many scientific and business applications, the underlying data can be represented using a graph of the data structure G that includes nodes or vertices V[1...n] connected by edges E[1...m]. For example, an application that analyzes a corpus of web pages may represent each web page as a node and a link between documents as edges. The objective of the application may be to identify groups of web pages that are related, which may be solved by identifying groups of nodes that are connected, often referred to as finding "connected components." A group of nodes is connected if there exists a path of edges from each node in the group to every other node in the group and there is no edge from a node in the group to a node that is not in the group.

Several algorithms have been proposed for providing the connected components of a graph. These algorithms assign labels to each node of the graph such that two nodes are connected (i.e., by a path of edges) if and only if the two nodes have the same label. These algorithms include traversal algorithms that "walk" the edges of the graph to identify connected nodes. The traversal algorithms include depth first search algorithms and breadth first search algorithms. Such traversal algorithms can, however, be computationally expensive. In particular, as a graph increases in size to hundreds of thousands or millions of nodes, the time spent finding the connected components can become prohibitive.

To help reduce the time it takes to find connected components, various algorithms have been adapted for execution on a parallel computer. A parallel computer typically has multiple processors that access a shared memory. Each processor can be executing instructions of an algorithm in parallel. Although the use of a parallel computer can help reduce the time needed to find connected components, in many cases the adapting of a serial algorithm to an efficient parallel algorithm can be difficult if not impossible.

One well-known parallel algorithm for finding connected components of a graph is referred to in the computer science literature as a "hook-and-compress" or "hook-and-jump" algorithm. See, Cormen, T., Leiserson, C., and Rivest, R., "Introduction to Algorithms," The MIT Press, 1991, pp. 727-728. Although there are many variations of the hook-and-compress algorithm, these algorithms generally operate by repeatedly performing a hook pass followed by a compress pass until the labels of the nodes do not change during a pass. Each label points to another node, such that upon completion, connected nodes point it to same node. Each node is initially assigned a label that points to itself. Each hook pass selects each edge and sets the label of the pointed-to node of the node with the higher label to the label of the other node connected to the edge. Each compress pass selects the node and sets the label of the node to the label of its pointed-to node. The hook-and-compress algorithm can generally be represented by the following pseudo-code where each node is assigned a unique number, C[i] contains the label of node i, and edges are identified by the number of the nodes they connect.

```
hook-and-compress (G):
    for all nodes i
        C[i]=i
    repeat
        hook (G)
        compress (G)
    until C equals last C
hook (G):
    for all edges (i,j) of G
        if (C[i] > C[j] and C[i] == C[C[i]]) C[C[i]] = C[j]
compress:
    for all nodes i of G
        C[i] = C[C[i]]
```

In both the hook and compress steps, the iterations may execute in parallel. In particular, for the hook step, multiple processors may be executing the hook algorithm on the graph that is stored in the shared memory (and similarly for the compress step). The parallel hook-and-compress algorithm, however, encounters "hot spots" as the number of distinct labels decreases. A hot spot is a memory location that is repeatedly written and read. For example, as the hook-and-compress algorithm proceeds, more and more nodes tend to point to the same node. The accessing of that pointed-to node reduces speed of the algorithm such that the accesses to the label of that pointed-to node are serialized. Also, since during the compress steps each node is visited a number of times, that is proportional to the logarithm of the longest of the shortest path between two nodes. Thus, the hook-and-compress algorithm can be less efficient for large graphs than a sequential depth first search, which visits each node only twice (once in each direction).

DETAILED DESCRIPTION

Figure 1:
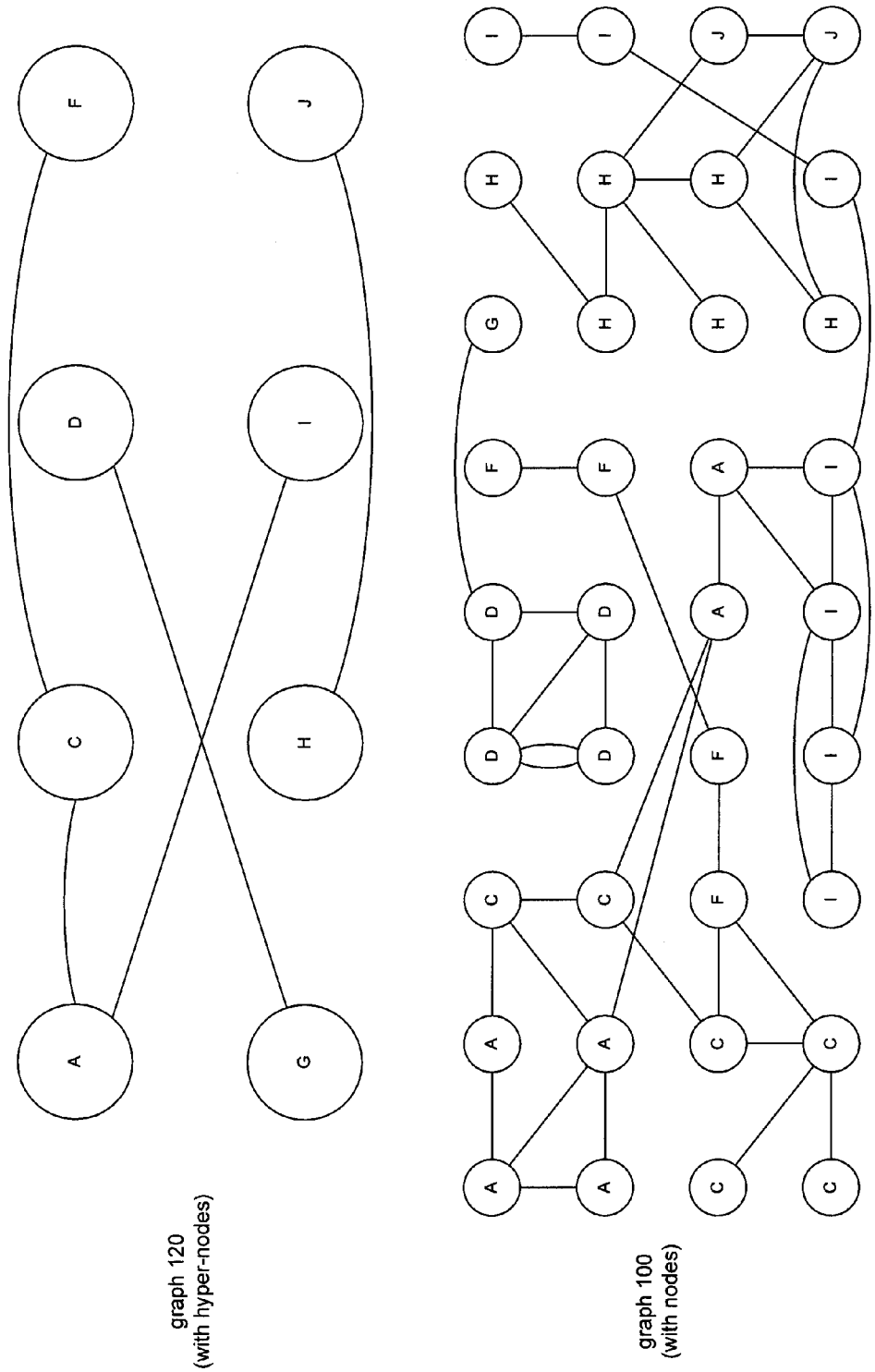
FIG. 1 is a diagram illustrating a graph and its corresponding hyper-graph in one embodiment.

A method and system for finding connected components of a graph using a parallel algorithm is provided. In one embodiment, the connected nodes system performs a search algorithm in parallel to identify subgraphs of the graph in which the nodes of the subgraph are connected. The connected nodes system also identifies which subgraphs have at least one edge between their nodes. Thus, the connected nodes system effectively generates a hyper-graph with the subgraphs as hyper-nodes that are connected when subgraphs have at least one edge between their nodes. The connected nodes system may then perform a conventional connected component algorithm on the hyper-graph to identify the connected hyper-nodes, which effectively identifies the connected nodes of the underlying graphs. Although the search algorithm is performed in parallel, the hot spot problem can be significantly reduced since there are likely many more subgraphs identified by the search algorithm than groups of connected nodes that are ultimately identified. That is, the access to the hot spot of each group is distributed over the number of locations generally equal to the number of subgraphs of each group. In one embodiment, the connected nodes system performs a three-phase process. In phase I, the system performs a search algorithm in parallel to identify the hyper-graph. In phase II, the system performs a hook-and-compress algorithm on the hyper-graph, which also may be performed in parallel. In phase III, the system propagates the labels of the connected hyper-nodes to the connected nodes of the underlying graph, which also may be performed in parallel.

Phase I implements the search algorithm so that each iteration of the algorithm can execute on a separate processor (or separate thread of a processor in a computer system with a multi-threaded architecture ("MTA")) in parallel. Each instance of the phase I algorithm loops (iterates) selecting an "unvisited" node of the underlying graph, designating that node as a hyper-node, and identifying a corresponding subgraph whose nodes are connected to the selected node. When there are no more unvisited nodes to select, each instance terminates, and when all the instances terminate, the phase I algorithm terminates. A node is "visited" when it is processed (e.g., selected or otherwise found) by the search algorithm. The phase I algorithm designates each selected node as being a root node of a subgraph that is to be identified. Each root node will correspond to a hyper-node of the hyper-graph. The phase I algorithm then searches along edges for nodes that are connected to the root node to identify a subgraph. When the phase I algorithm finds a previously unvisited node, it designates the found node as being connected to the root node. For example, the phase I algorithm may label the found node with the identifier of the root node. When the phase I algorithm finds a node that has already been visited, then that found node has already been designated as being connected to a root node either by this instance of the algorithm or a different instance of the algorithm. If the found node has been designated as being connected to a different root node, then the phase I algorithm indicates that there is an edge (i.e., hyper-edge) between the subgraph of the current root node and the subgraph of the different root node. When the phase I algorithm finds a node that has already been visited, it terminates the searching for nodes connected to the subgraphs through that found node because those nodes were previously identified as being connected to the current root node during the current iteration or to a different root node during an iteration of a different instance. Thus, each iteration of the phase I algorithm terminates when no more unvisited connected nodes are found. Although each iteration may perform a depth (or breadth) first search, the interaction between the instances executing in parallel results in a search that is not strictly depth first. In addition, because the execution of each instance is affected by the execution of other instances, the phase I algorithm is non-deterministic in the sense that different hyper-graphs are identified depending on the timing and scheduling of the instances, the number of instances, the number of processors, and so on.

Phase II may implement various search algorithms on the hyper-graph to identify connected hyper-nodes. For example, the phase II algorithm may be a conventional depth first search, breadth first search, hook-and-compress algorithm, and so on. In general, it may, however, not be appropriate to apply the phase I algorithm to the hyper-graph to identify "hyper-subgraphs," because as the number of subgraphs approaches the number of instances that execute in parallel, the first iteration of each instance will visit a hyper-node and stop because every other instance has visited one of the other hyper-nodes in parallel. However, if the number of hyper-nodes exceeds the number of instances by a significant amount, then it may be advantageous to apply the phase I algorithm to a hyper-graph.

Phase III may implement various algorithms for propagating the label of a hyper-node to the nodes in the underlying graph for each connected hyper-node. For example, the phase III algorithm may in parallel perform a depth first search on each subgraph to propagate the labels to the nodes of the subgraphs.

FIG. 1 is a diagram illustrating a graph and its corresponding hyper-graph in one embodiment. In this example, graph 110 includes nodes indicated by small circles that are interconnected by edges indicated by lines between the small circles. Graph 120 includes hyper-nodes indicated by large circles that are interconnected by hyper-edges indicated by lines between the large circles. The phase I algorithm labels each node of the graph and hyper-node (which may actually be a root node of the graph rather than a separate hyper-node) of the hyper-graph with a letter to indicate a hyper-node and its corresponding subgraph. In this example, the hyper-graph indicates that the subgraph labeled A is connected to the subgraphs label C and I and the subgraph labeled C is connected to the subgraph labeled F. The phase II algorithm will identify that the hyper-nodes labeled A, C, F, and I are connected hyper-nodes. The phase III algorithm will propagate one of those labels to the nodes of the corresponding subgraphs. As a result, for example, all the nodes labeled with C, F, and I are relabeled with an A. Similarly, all the nodes labeled with a G are relabeled with a D, and all the nodes with a J are relabeled with an H. The relabeling indicates that the graph 110 contains three groups of connected nodes labeled with A, D, and H.

Figure 2:
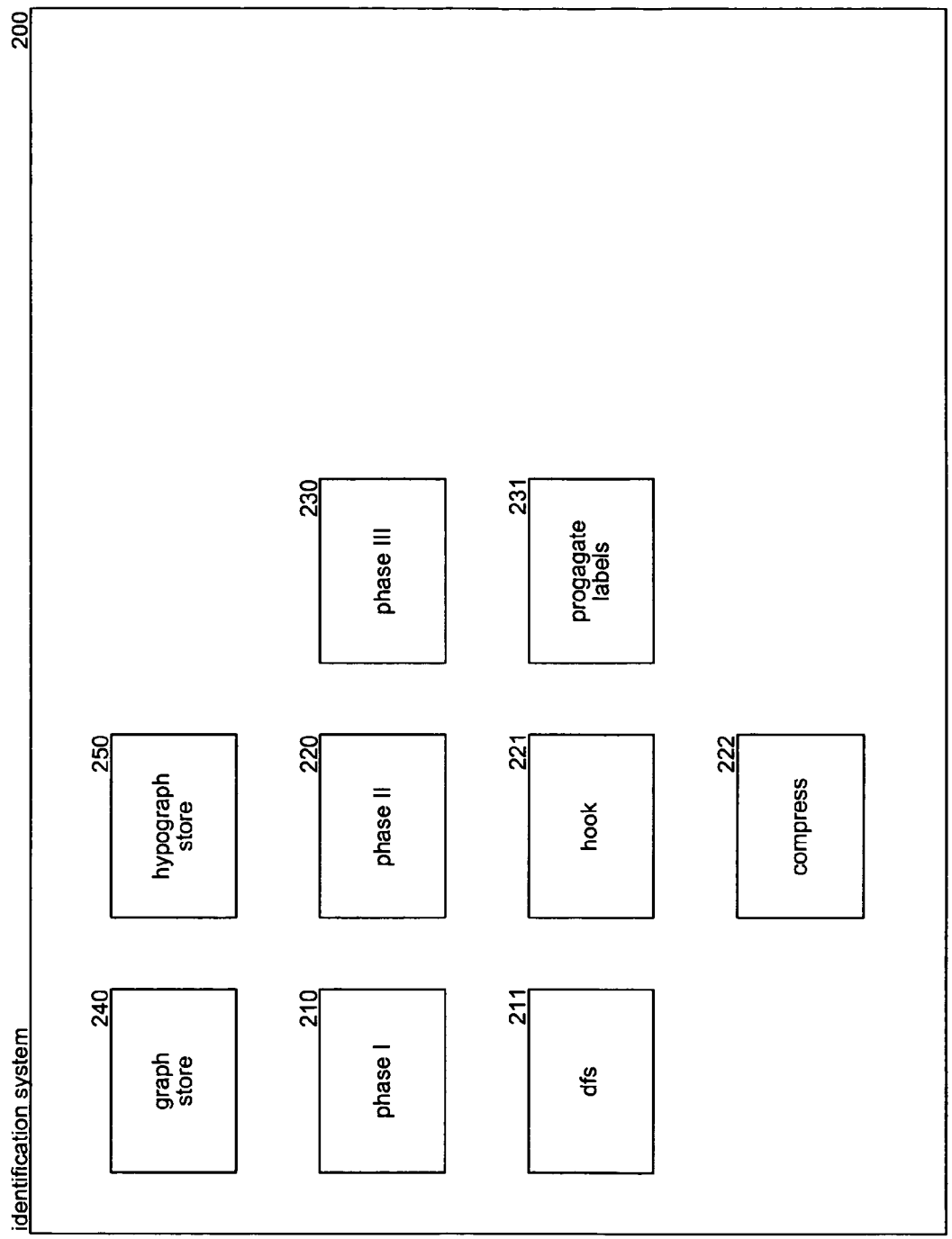
FIG. 2 is a block diagram that illustrates components of the connected nodes system in one embodiment.

FIG. 2 is a block diagram that illustrates components of the connected nodes system in one embodiment. The connected nodes system 200 includes a phase I component 210, a phase II component 220, and a phase III component 230. The phase I component implements the phase I algorithm by invoking a depth first search component 211 for each of the selected root nodes. The phase I algorithm is performed in parallel. The phase II component implements the phase II algorithm by repeatedly invoking a hook component 221 and a compress component 222. Each iteration of the hook component and the compress component may be performed in parallel. The phase III component implements the phase III algorithm by invoking a propagate labels component 231 for each subgraph whose nodes need to be relabeled. Each iteration of the phase III component may be performed in parallel. The connected nodes system also includes a graph store 240 and a hyper-graph store 250. The graph store contains a data structure describing the underlying graph, and the hyper-graph store contains a data structure describing the identified hyper-graph.

The connected nodes system may be implemented in various operating environments that include multiple processors, multiple streams or threads of execution, and any combination of multiple processors with multiple streams. The connected nodes system may be described in the general context of computer-executable instructions, such as program modules, executed by one or more computers or other devices. Generally, program modules include routines, programs, objects, components, data structures, and so on that perform particular tasks or implement particular abstract data types. Typically, the functionality of the program modules may be combined or distributed as desired in various embodiments.

The following pseudo-code represents the algorithm of the connected nodes system in one embodiment.

```
PHASE I: Concurrent Search and Hash
    pfor all nodes v
        if v is unvisited: mark v as a root, dfs(v)
    dfs(v):
        pfor all unvisited neighbors w of v
            C[w] = C[v], dfs(w)
        pfor visited neighbors w with (C[w] ≠C[v]),
            store (C[v],C[w]) uniquely in hash table
PHASE II: Hook-and-Compress
    repeat:
        pfor all edges (v,w) in hash table:
            if (C[v] < C[w] AND C[v] == C[C[v]]) C[C[v]] = C[w]
        pfor all roots v
            C[v] = C[C[v]]
    until C no longer changes
PHASE III: Component Relabeling
    pfor roots v
        perform a depth first search setting C[w] to C[v]
```

Figure 3:
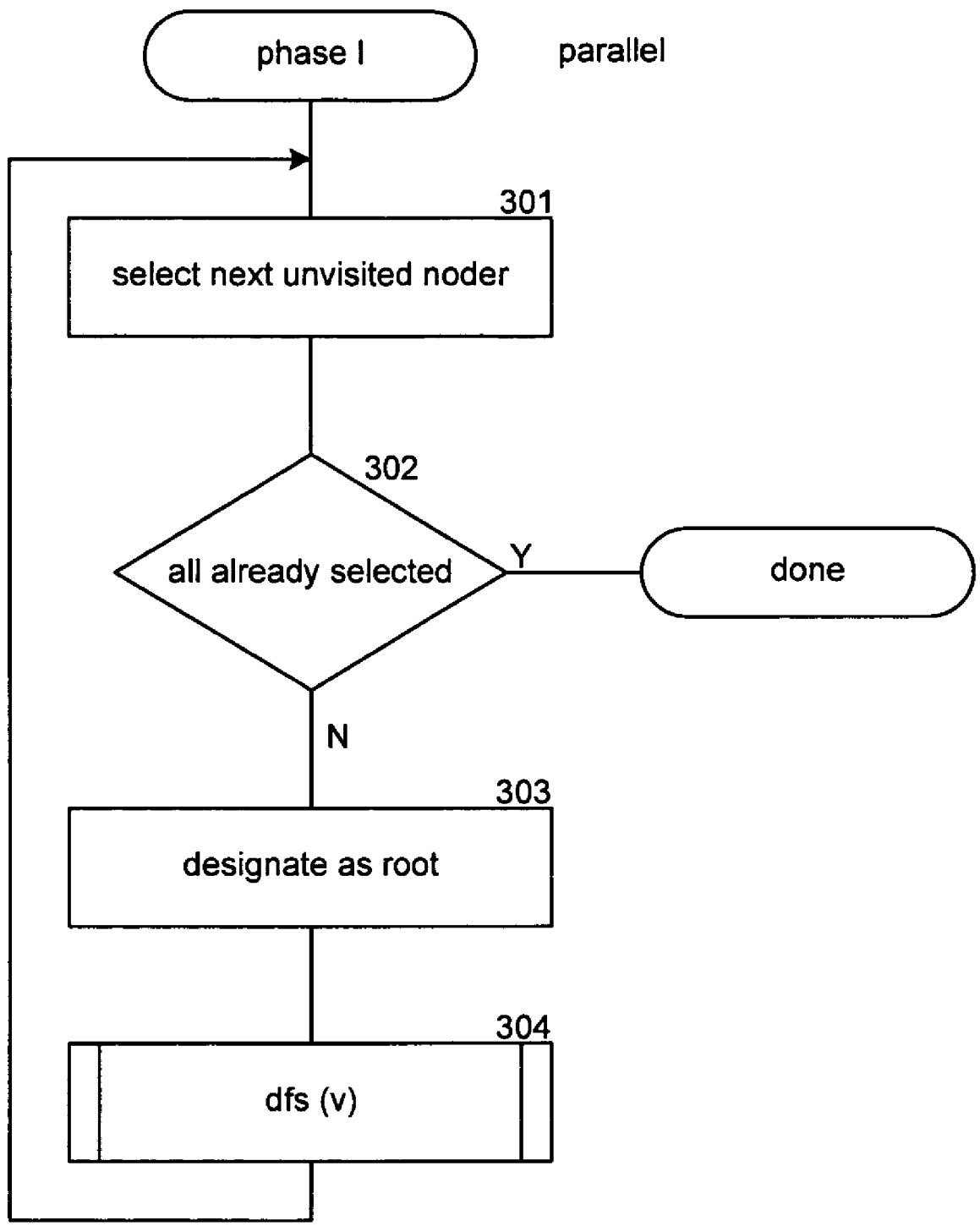
FIG. 3 is a flow diagram that illustrates the processing of the phase I component in one embodiment.

FIG. 3 is a flow diagram that illustrates the processing of the phase I component in one embodiment. Multiple instances of the phase I component may execute in parallel. The component loops selecting unvisited nodes and identifying a subgraph for the selected node. In block 301, the component selects the next unvisited node. The selecting of a node visits the node. In decision block 302, if there are no more unvisited nodes of the graph (by this instance or a parallel instance of the component), then the component completes, else the component continues at block 303. In block 303, the component designates the selected node as a root node corresponding to a hyper-node. In block 304, the component invokes a search algorithm to search for a subgraph connected to the root node. The component then loops to block 301 to select the next unvisited node.

Figure 4:
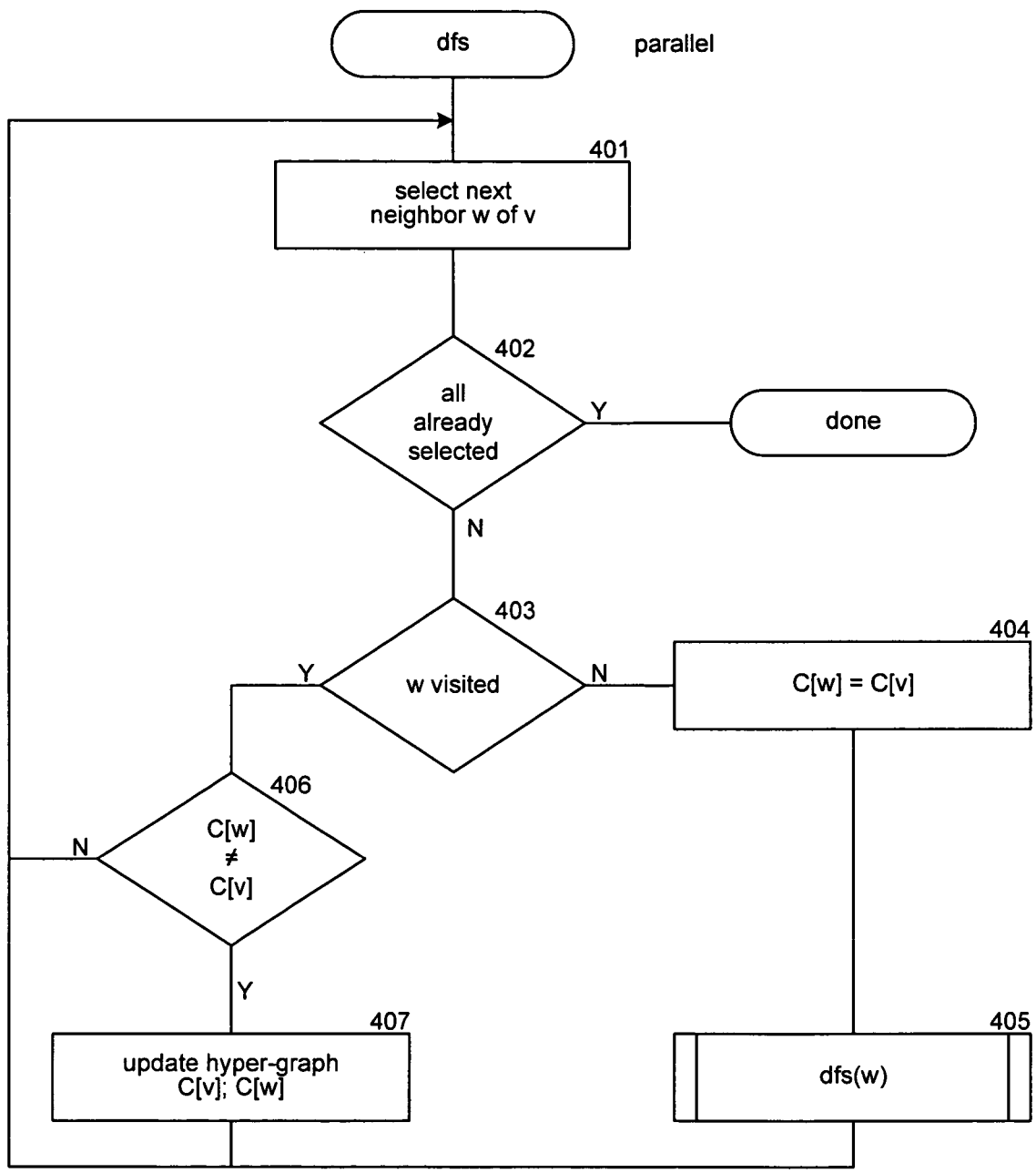
FIG. 4 is a flow diagram that illustrates the processing of the search component of the phase I algorithm in one embodiment.

FIG. 4 is a flow diagram that illustrates the processing of the search component of the phase I algorithm in one embodiment. In this example, the component implements a depth first search algorithm. The component is passed a node and identifies nodes that are connected to the passed node. For each invocation, multiple instances of the component can be executed in parallel. In block 401, the component selects the next neighbor node of the passed node, which visits the neighbor node. In decision block 402, if all the neighbor nodes have already been selected (by this instance or a parallel instance of the current invocation), then the component completes, else the component continues at block 403. In decision block 403, if the selected neighbor node had already been visited before this visit, then the component continues at block 406, else the component continues at block 404. In block 404, the component sets the label of the neighbor node to the label of the passed node. In block 405, the component recursively invokes the search component to effect the depth first search. The component then loops to block 401 to select the next neighbor node of the passed node. In decision block 406, if the passed node and the selected neighbor node do not have the same label, then the selected neighbor node is designated as being in a subgraph by a different instance of the component and the component continues at block 407, else the component loops to block 401 to select the next neighbor node of the passed node. In block 407, the component updates the hyper-graph to indicate that the hyper-graph contains a hyper-edge from the hyper-node corresponding to the subgraph with the label of the passed node to the hyper-node corresponding to the subgraph with the label of the selected neighbor node. The component may identify the hyper-edges by the labels of the connected hyper-nodes. The component may store the hyper-edges of the hyper-graph in a hash table or other data structure. Since one hyper-edge is sufficient to indicate that a pair of hyper-nodes is connected, the component only needs to store one hyper-edge for each connected pair of hyper-nodes. The component then loops to block 401 to select the next neighbor node of the passed node.

Figure 5:
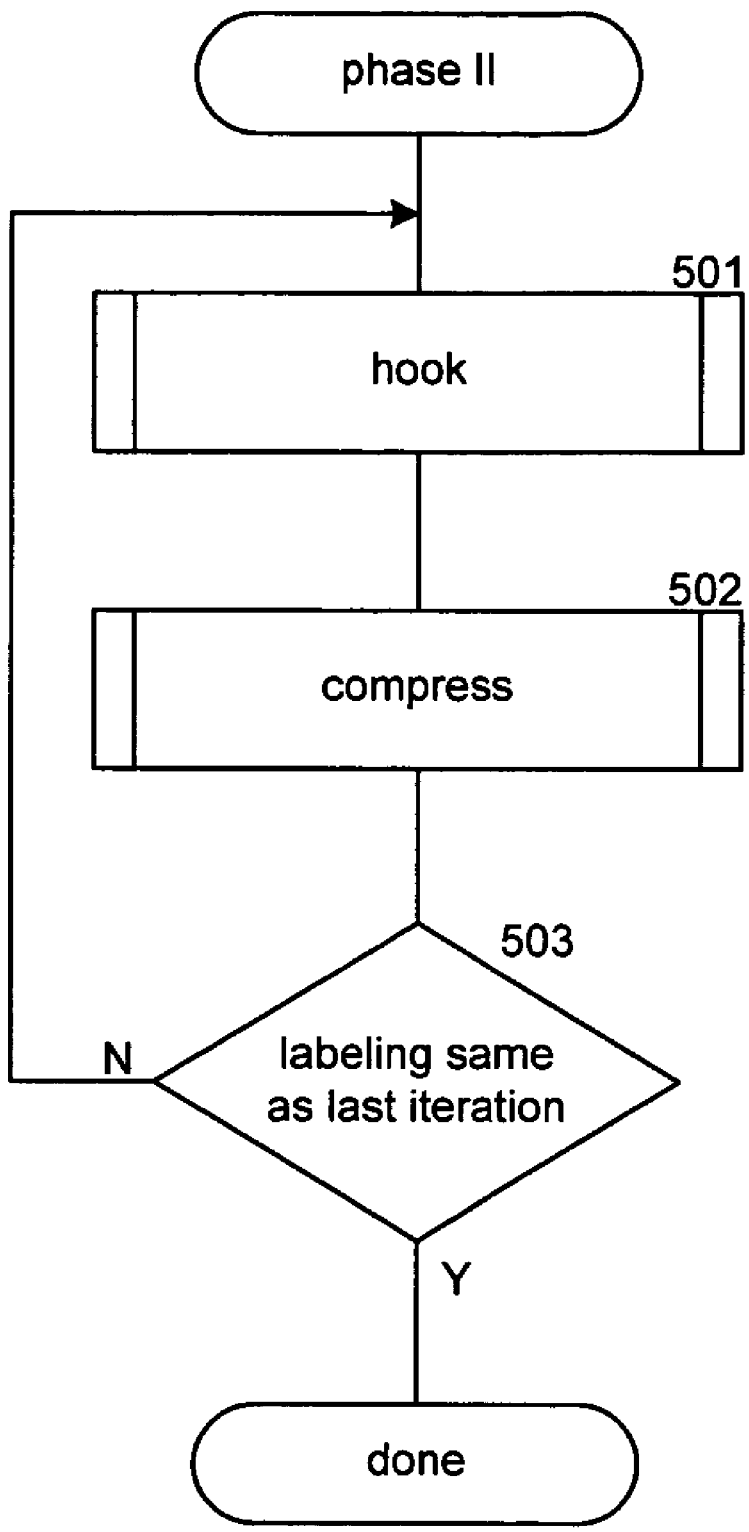
FIG. 5 is a flow diagram that illustrates the processing of the phase II component in one embodiment.

FIG. 5 is a flow diagram that illustrates the processing of the phase II component in one embodiment. The component loops invoking hook and compress components until the labeling stabilizes. In block 501, the component invokes the hook component. In block 502, the component invokes the compress component. In decision block 503, if the labeling has not changed in this iteration, then the component completes, else the component loops to block 501 to invoke the hook component.

Figure 6:
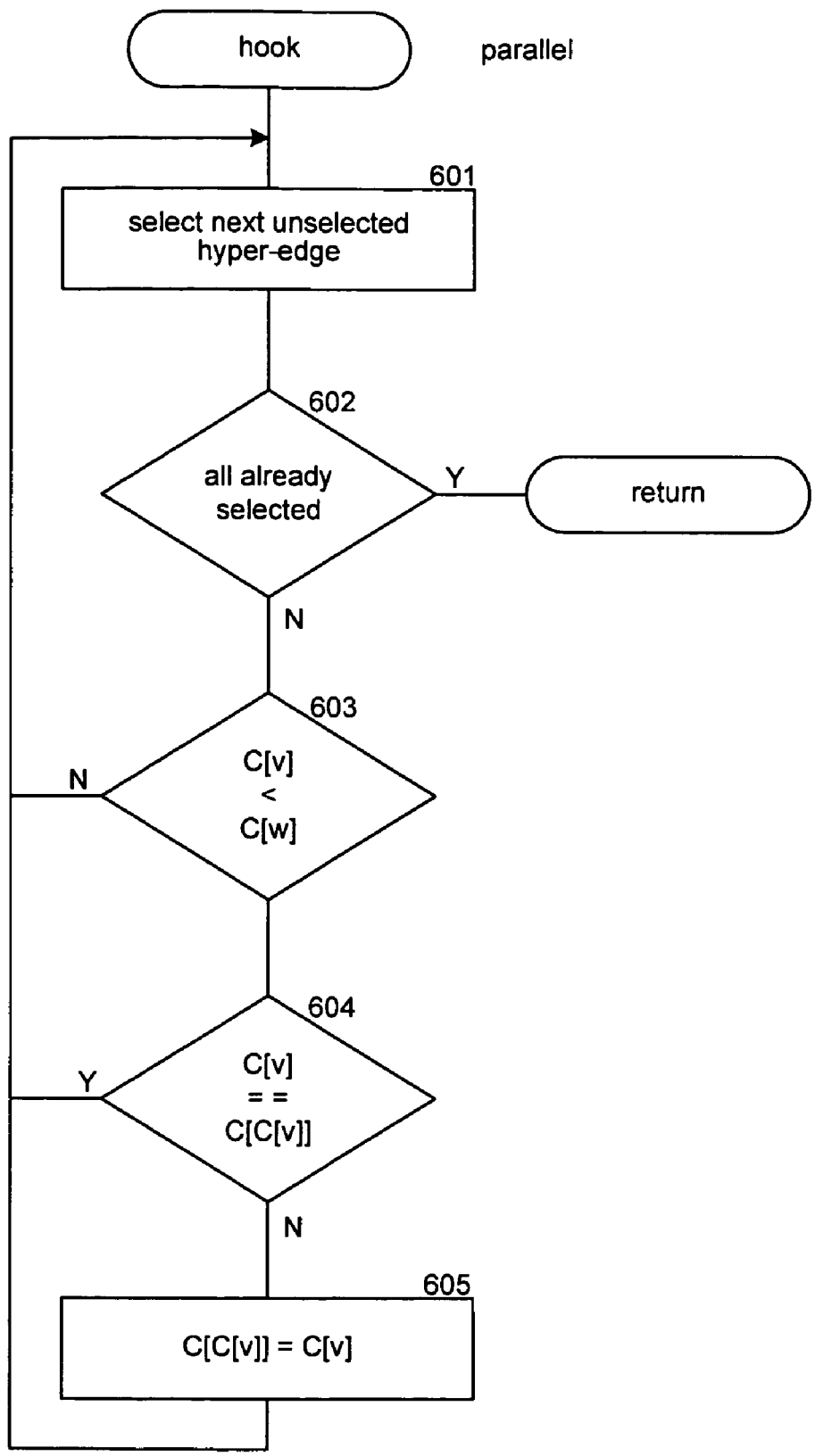
FIG. 6 is a flow diagram that illustrates the processing of the hook component in one embodiment.

FIG. 6 is a flow diagram that illustrates the processing of the hook component in one embodiment. The component may perform conventional hook processing on the hyper-graph. Multiple instances of the component may execute in parallel. In block 601, the component selects the next unselected hyper-edge. In decision block 602, if all the hyper-edges have already been selected (by this instance or a parallel instance of the current invocation), then the component returns, else component continues at block 603. In decision block 603, if the label of the first hyper-node connected by the selected hyper-edge is less than the label of the second hyper-node connected to the selected hyper-edge, then the component continues at block 604, else the component loops to block 601 to select the next unselected hyper-edge. In decision block 604, if the label of the first hyper-node is the same as the label of the pointed-to node of the first hyper-node, then the component loops to block 601 to select the next unselected hyper-edge, else the component continues at block 605. In block 605, the component sets the label of the pointed-to node of the first hyper-node to the label of the first hyper-node and loops to block 601 to select the next unselected hyper-edge.

Figure 7:
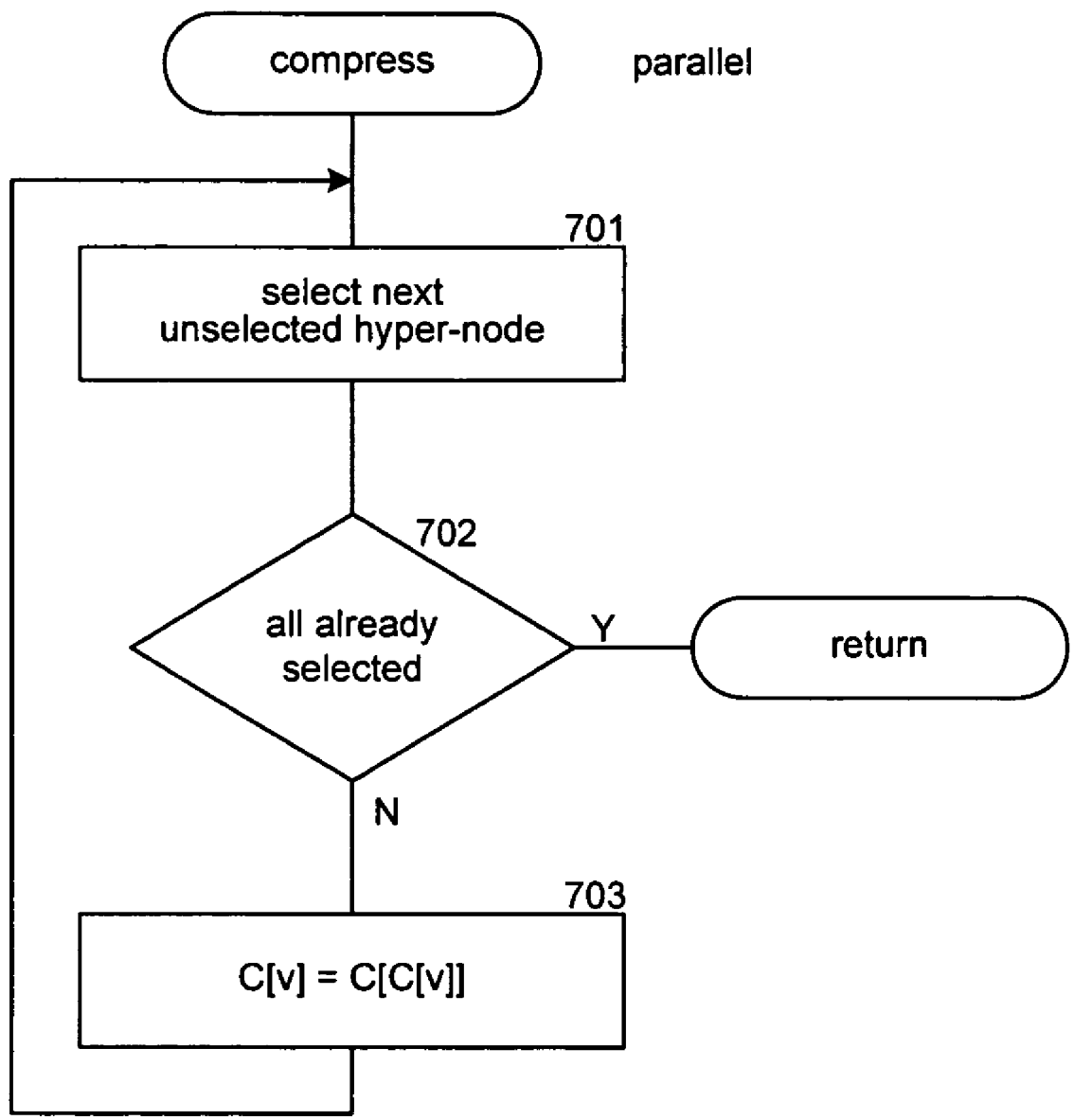
FIG. 7 is a flow diagram that illustrates the processing of the compress component in one embodiment.

FIG. 7 is a flow diagram that illustrates the processing of the compress component in one embodiment. The component may perform conventional compress processing on the hyper-graph. Multiple instances of the component may execute in parallel. In block 701, the component selects the next unselected hyper-node. In decision block 702, if all the hyper-nodes have already been selected (by this instance or a parallel instance of the current invocation), then the component returns, else the component continues at block 703. In block 703, the component sets the label of the selected hyper-node to the label of the pointed-to node of the selected hyper-node and then loops to block 701 to select the next hyper-node.

Figure 8:
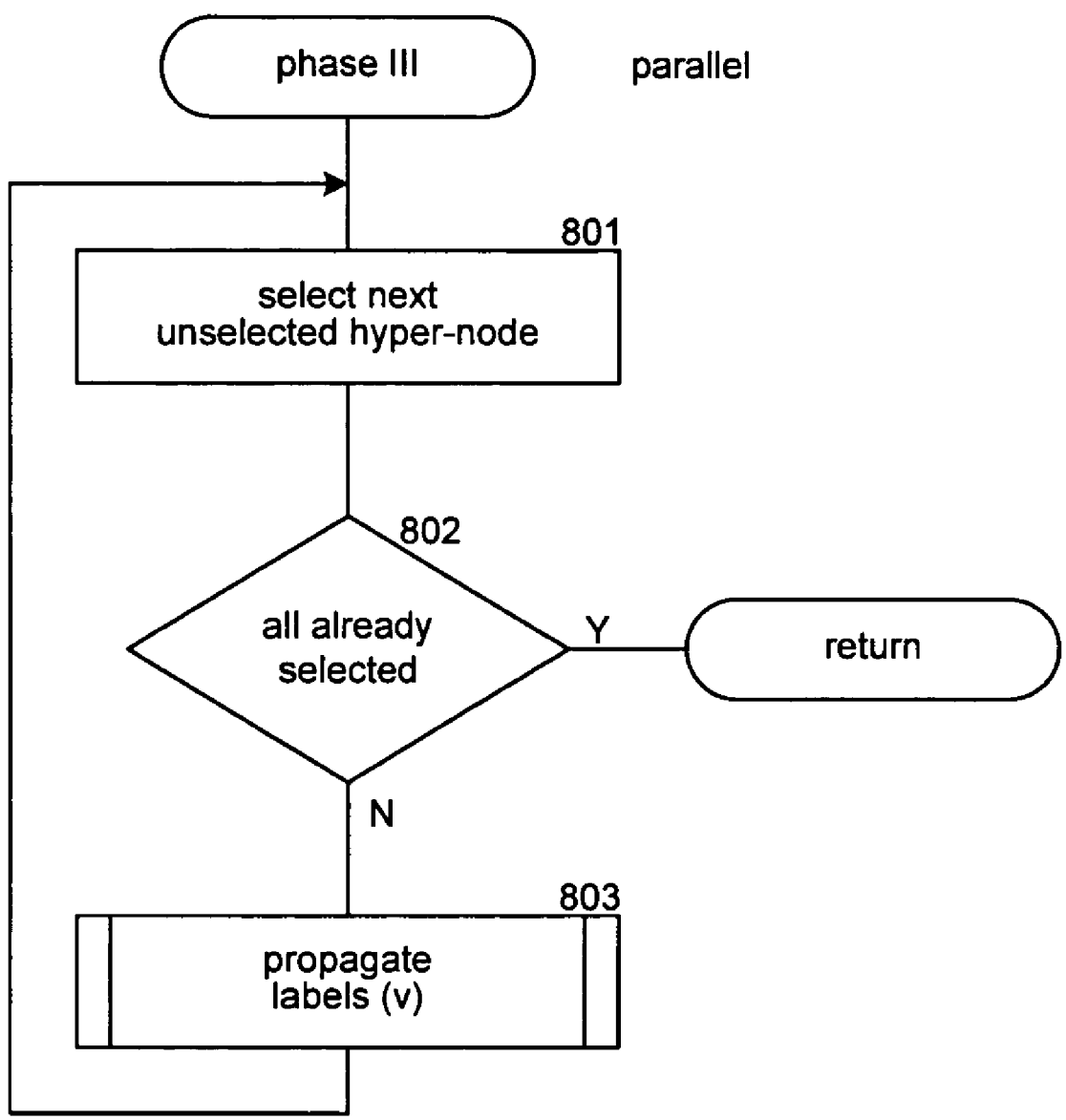
FIG. 8 is a flow diagram that illustrates the processing of the phase III component in one embodiment.

FIG. 8 is a flow diagram that illustrates the processing of the phase III component in one embodiment. Multiple instances of the component may execute in parallel. In block 801, the component selects the next unselected hyper-node. In decision block 802, if all the hyper-nodes have already been selected (by this parallel instance or another), the component returns, else the component continues at block 803. In block 803, the component invokes the propagate labels component passing an indication of the selected hyper-node and then loops to block 801 to select the next hyper-node.

Figure 9:
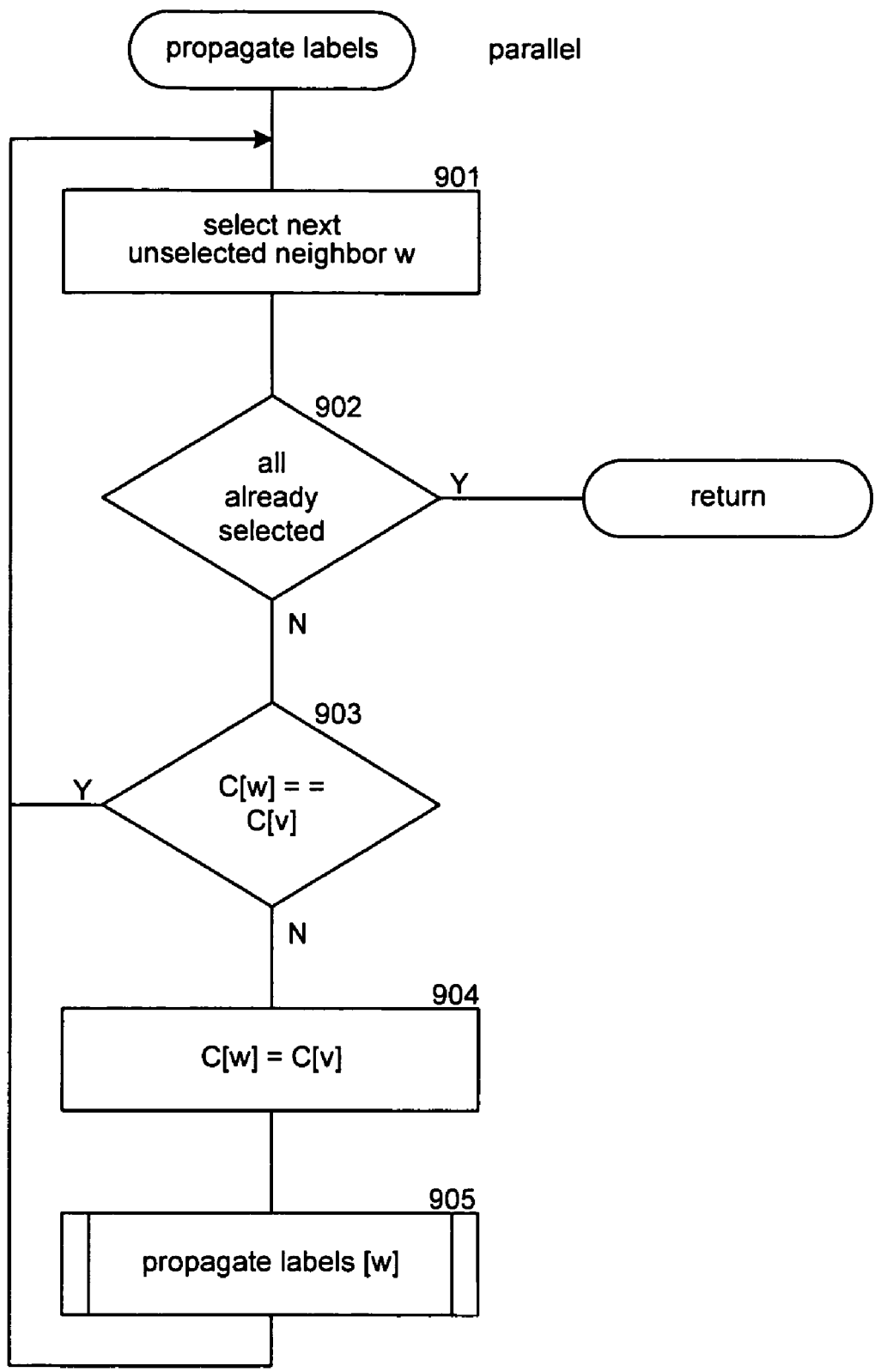
FIG. 9 is a flow diagram that illustrates the processing of the propagate labels component in one embodiment.

FIG. 9 is a flow diagram that illustrates the processing of the propagate labels component in one embodiment. The component propagates a label using a depth first search. The component is passed a node whose label is to be propagated. Multiple instances of the component may execute in parallel. In block 901, the component selects the next unselected neighbor node of the passed node. In decision block 902, if all the neighbor nodes have already been selected (by this instance or a parallel instance of the current invocation), then the component returns, else the component continues at block 903. In decision block 903, if the labels of the passed node and the label of the selected neighbor node are the same, then the component loops to block 901 to select the next unselected neighbor node, else the component continues at block 904. In block 904, the component sets the label of the selected neighbor node to the label of the passed node. In block 905, the component recursively invokes the propagate labels component passing the selected neighbor node and then loops to block 901 to select the next unselected neighbor node.

In one embodiment, the phase II component may replicate the data of a hot spot location to duplicate hot spot locations to reduce the access contention of a hot spot location. The replication technique may be applied to any algorithm that may have hot spot locations. The component may maintain a replication table (e.g., implemented as a hash table) that contains multiple copies of the label of a hot spot. Each read request for a hot spot locations is directed to the replication table and distributed to one of the duplicate hot spot location in the replication table. Each write request for a hot spot location is directed to the actual hot spot location. When the actual hotspot location is updated, the new label is replicated to the duplicate hot spot locations. The use of duplicate hot spot locations with the out-of-date value can continue to be accessed during the replication process as the out-of-date value is still a valid value, but will need to be eventually updated. The component may allocate the number of duplicate hot spot locations based on the frequency at which the hot spot location is anticipated to be accessed and may be limited to the maximum number of instances that may be executing in parallel. Also, the component may dynamically adjust the allocation based on the execution characteristics of the component.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Accordingly, the invention is not limited except as by the appended claims.

I claim:

1. A method in a computer system with multiple processors and memory for identifying connected nodes in a graph, the method comprising:
   providing in the memory a graph having nodes and edges connecting the nodes of the graph;
   identifying subgraphs of nodes by performing at each of the processors in parallel the following:
      selecting by the processor for visiting an unvisited node of the graph and marking it as a root node;
      searching by the processor for nodes that are connected to the root node;
      when an unvisited connected node is found, visiting by the processor the unvisited found node and indicating that the unvisited found node is connected to the root node such that the root node and the nodes indicated as connected to the root node form a subgraph of nodes;
      when a visited connected node is found,
         when the visited found node is indicated as connected to a different root node, indicating by the processor a mapping between the root node and the different root node, the mapping indicating that the subgraph of the root node is connected to the subgraph of the different root node; and
   after the subgraphs are identified, applying by a processor an algorithm to the identified subgraphs and mappings, wherein the subgraphs represent hyper-nodes and the mappings represent hyper-edges between the hyper-nodes, to identify groups of connected nodes, wherein a group of nodes is connected if there exists a path of edges from each node in the group to every other node in the group and there is no edge from a node in the group to a node that is not in the group.

2. The method of claim 1 wherein the search for nodes that are connected to a root node is performed in parallel.

3. The method of claim 2 wherein the searching is a depth first search.

4. The method of claim 2 wherein the searching is a breadth first search.

5. The method of claim 1 wherein when a visited connected node is found, not searching for nodes that are connected to the root node through the found node.

6. The method of claim 1 wherein when an unvisited connected node is found, continuing searching for nodes that are connected to the root node through the found node.

7. The method of claim 1 wherein the algorithm is a hook-and-compress algorithm.

8. The method of claim 1 wherein the algorithm uses a depth first search.

9. The method of claim 1 wherein the algorithm uses a breadth first search.

10. A system with multiple processors for identifying connected nodes of a graph, comprising:
    a memory storing computer-executable instructions of
       a phase I component that identifies a hyper-graph of hyper-nodes corresponding to subgraphs of connected nodes and of hyper-edges corresponding to connections between the subgraphs by executing an algorithm on multiple processors in parallel to identify subgraphs of nodes of the graph, each node of a subgraph having a path of edges to a root node of the subgraph, the algorithm being nondeterministic in the sense that different subgraphs are identified based on number of processors and other computational resources used by the algorithm;
       a phase II component that identifies connected hyper-nodes of the hyper-graph; and
       a phase III component that indicates that the nodes of the subgraphs corresponding to connected hyper-nodes are connected; and
    multiple processors, the multiple processors for executing in parallel the computer-executable instructions of the phase I component, a processor for executing the computer-executable instructions of the phase II component and the phase III component.

11. The system of claim 10 wherein the phase I component in parallel selects a root node, identifies a subgraph of nodes that are connected to the root node, and identifies connections between subgraphs.

12. The system of claim 11 wherein the identifying of nodes of a subgraph is performed in parallel.

13. The system of claim 10 wherein the phase II component identifies connected subgraphs using a hook-and-compress algorithm.

14. The system of claim 10 wherein the phase II component identifies connected subgraphs using a non-hook-and-compress algorithm.

15. The system of claim 10 wherein the phase III component uses a search algorithm.

16. A computer system with multiple processors for identifying connected nodes in a graph, comprising:
   a graph store containing a representation of a graph having nodes and edges connecting the nodes of the graph;
   a memory storing computer-executable instructions of
      a component that executes on the multiple processors in parallel to identify subgraphs of nodes of the graph by repeating the following until all nodes of the graph are visited:
         visiting an unvisited node of the graph and marking it as a root node of a subgraph; and
         identifying other nodes of the subgraph of the root node by
            searching for nodes that are connected to the root node via path of one or more edges;
            when an unvisited connected node is found, visiting the found node and indicating that the found node is a node of the subgraph of the root node;
            when a visited connected node is found and is a node of a subgraph for a different root node, storing a mapping between the root node and the different root node, the mapping indicating that the subgraph of the root node is connected to the subgraph of the different root node; and
      a component that, after the subgraphs are identified, applies an algorithm to the identified subgraphs and mappings wherein the subgraphs represent hyper-nodes and the mappings represent hyper-edges between the hyper-nodes to identify groups of connected nodes, wherein a group of nodes is connected if there exists a path of edges from each node in the group to every other node in the group and there is no edge from a node in the group to a node that is not in the group; and
   multiple processors for executing in parallel the computer-executable instructions stored in the memory.

17. The computer system of claim 16 wherein the algorithm is a hook-and-compress algorithm.

* * * * *

UNITED STATES PATENT AND TRADEMARK OFFICE
CERTIFICATE OF CORRECTION

PATENT NO.         : 7,764,629 B2                                                Page 1 of 1
APPLICATION NO.    : 11/201765
DATED              : July 27, 2010
INVENTOR(S)        : Simon H. Kahan It is certified that error appears in the above-identified patent and that said Letters Patent is hereby corrected as shown below:

On Sheet 2 of 9, FIG. 2, Reference Numeral 231, line 1, delete "progagate" and insert -- propagate --, therefor.

Signed and Sealed this

Second Day of November, 2010

David J. Kappos
*Director of the United States Patent and Trademark Office*